(12) United States Patent
Thapar

(10) Patent No.: US 6,878,994 B2
(45) Date of Patent: Apr. 12, 2005

(54) MOSGATED DEVICE WITH ACCUMULATED CHANNEL REGION AND SCHOTTKY CONTACT

(75) Inventor: Naresh Thapar, Redundo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/646,667

(22) Filed: Aug. 22, 2003

(65) Prior Publication Data

US 2004/0119103 A1 Jun. 24, 2004

Related U.S. Application Data

(60) Provisional application No. 60/405,756, filed on Aug. 22, 2002.

(51) Int. Cl.$^7$ .............................................. H01L 29/76
(52) U.S. Cl. ................... 257/330; 257/331; 257/341; 257/476; 257/486
(58) Field of Search ................... 257/330, 331, 257/341, 476, 485, 486

(56) References Cited

U.S. PATENT DOCUMENTS

| | | | | |
|---|---|---|---|---|
| 5,679,966 A | * | 10/1997 | Baliga et al. ............... | 257/139 |
| 6,580,123 B2 | * | 6/2003 | Thapar ....................... | 257/330 |
| 2004/0119103 A1 | * | 6/2004 | Thapar ....................... | 257/270 |

* cited by examiner

*Primary Examiner*—Mark V. Prenty
(74) *Attorney, Agent, or Firm*—Ostrolenk, Faber, Gerb & Soffen, LLP

(57) ABSTRACT

A MOSgated device has spaced vertical trenches lined with a gate oxide and filled with a P type polysilicon gate. The gate oxide extends along a vertical $N^-$ channel region disposed between an $N^+$ source region and an $N^-$ drift region. A Schottky barrier of aluminum is disposed adjacent the accumulation region extending along the trench to collect holes which are otherwise injected into the source region during voltage blocking. A common source or drain contact is connected to the $N^+$ region and to the Schottky contact. A two gate embodiment is disclosed in which separately energized gates are connected to alternatively located gate polysilicon volumes.

14 Claims, 5 Drawing Sheets

MOSGATED DEVICE WITH ACCUMULATED CHANNEL REGION AND SCHOTTKY CONTACT

RELATED APPLICATIONS

This application claims the benefit of U.S. Provisional Application No. 60/405,756, filed Aug. 22, 2002.

FIELD OF THE INVENTION

This invention relates to semiconductor devices and more specifically to a trench type device with on conduction through an accumulated channel region.

BACKGROUND OF THE INVENTION

Vertical conduction devices in which on state conduction is through an accumulated channel region are well known. U.S. Pat. No. 6,580,123 dated Jun. 17, 2003 in the name of Naresh Thapar (IR-1799) and assigned to the assignee of the present invention shows such a device.

FIG. 1 shows two adjacent cells of such a prior device in cross-section. The device of FIG. 1 comprises an $N^+$ substrate 10 which has an $N^-$ epitaxially deposited drift region 10a and base region 11. A high concentration source region diffusion 12 is formed on the top of epitaxial region 11. The side walls of each of trenches 13 are lined with a gate oxide 14, a bottom oxide TBO 15, and top isolation oxide tox, iso 16. A top source contact 20 contacts $N^+$ source region 12 and a bottom drain contact 21 contacts the bottom of $N^+$ substrate 10. Conductive P type polysilicon gates 30 fill the oxide lined trenches 13.

On state conduction in the device of FIG. 1 takes place through the accumulated channel region along the silicon mesa walls within $N^-$ channel region 11 which are lined with the gate oxide 14. The device is turned off by shorting the P type gates 30 to the source contact, which depletes out the $N^-$ channel region 11. Further, during blocking most of the charge in the $N^-$ drift region 10a is coupled to the gate so that $C_{oss}$ is almost identical to $C_{rss}$.

This type device has several benefits. For example, it has a zero $Q_{rr}$ since there is no body diode, as in a conventional vertical conduction MOSFET. Further, it can have a lower RA, using a sub micron cell pitch. The device can be manufactured with a 4 mask process with no critical alignments. Further, the device has bidirectional capability.

In order to block voltage, the device needs the P type gate 30 with a base resistivity for $N^-$ base 11 of about 5 ohm-cm resistivity or higher. Sub-micron mesa widths (the distance between adjacent trenches 14) are needed to obtain complete depletion of the $N^-$ channels 11 during turn-off.

As a result of this structure, the threshold voltage $V_{th}$ is, theoretically about 780 mV and is independent of gate oxide thickness for gate oxide 14.

A limitation found with the above structure is "snap-back" in the $BV_{DSS}$ characteristics. This snap back was observed between 8 to 22 volts, depending on the thickness of region 11. It is believed that this snap-back occurs because thermally or avalanche generated holes are back-injected into the source, leading to the injection of electrons from the source 20 into the $N^-$ drift region 10a.

BRIEF DESCRIPTION OF THE INVENTION

In accordance with the invention, a Schottky barrier device is integrated into the silicon containing the MOSFET device to enable collection of avalanche or thermally generated holes to reduce the back injected hole current into the $N^+$ source region thus averting the $BV_{DSS}$ snapback. The Schottky barrier can be integrated anywhere in the chip but is preferably located immediately adjacent to and within the $N^+$ source region. A dual gate structure and/or a source contact trench can be added to further control device $V_{th}$ and to improve light load efficiency.

In forming the Schottky contact, any desired Schottky barrier can be used. Good results have been obtained with Aluminum as the barrier. A novel geometry is provided to produce a relativity large area Schottky contact by forming the contact in and along the walls of a trench which extends through the $N^+$ source layer and into the $N^-$ base region.

A novel process is also provided for forming the P type gate. Thus, the gate trench is first formed and is then lined with polysilicon. This polysilicon is then implanted with a P type impurity, for example, boron. The trench is then completely filled with polysilicon and the implant is activated. This process has the advantage of a limited thermal cycle and produces a deeper penetration of boron into the polysilicon gate than is obtained by the heavier boron implant into a filled polysilicon mass in the trench.

DETAILED DESCRIPTION OF THE PREFERRED EMBODIMENT

Figure 1:
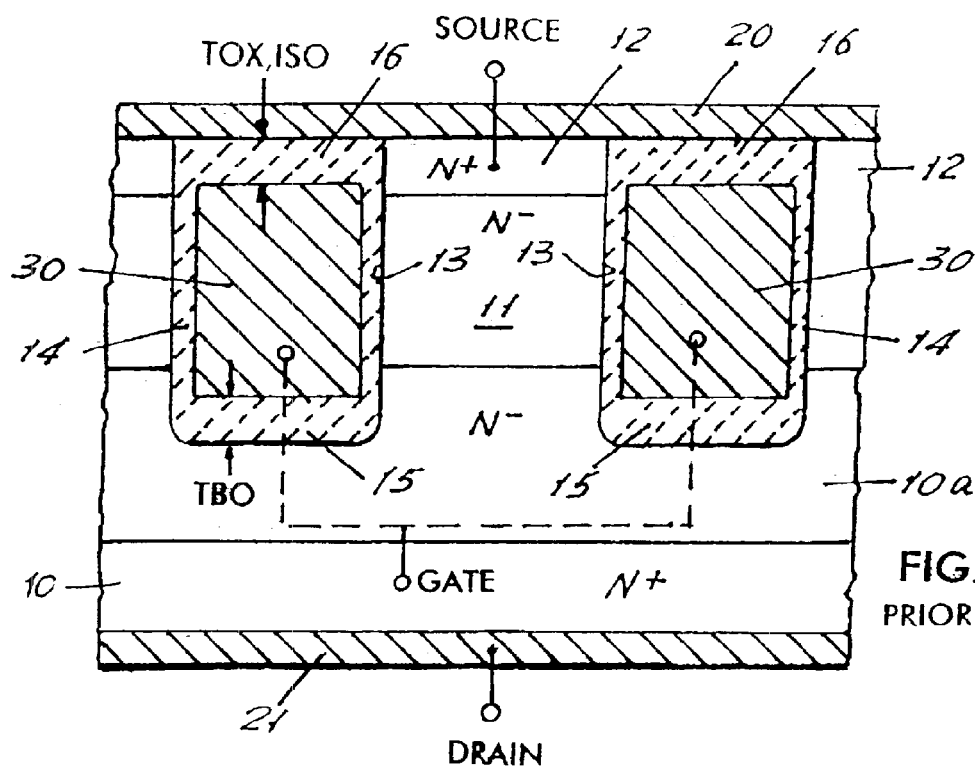
FIG. 1 is a cross-section of a small portion of a prior art device.

Referring first to FIGS. 2, 3, 4 and 5, the elements of those devices which are similar to those of FIG. 1 have the same identifying numeral.

Figure 2:
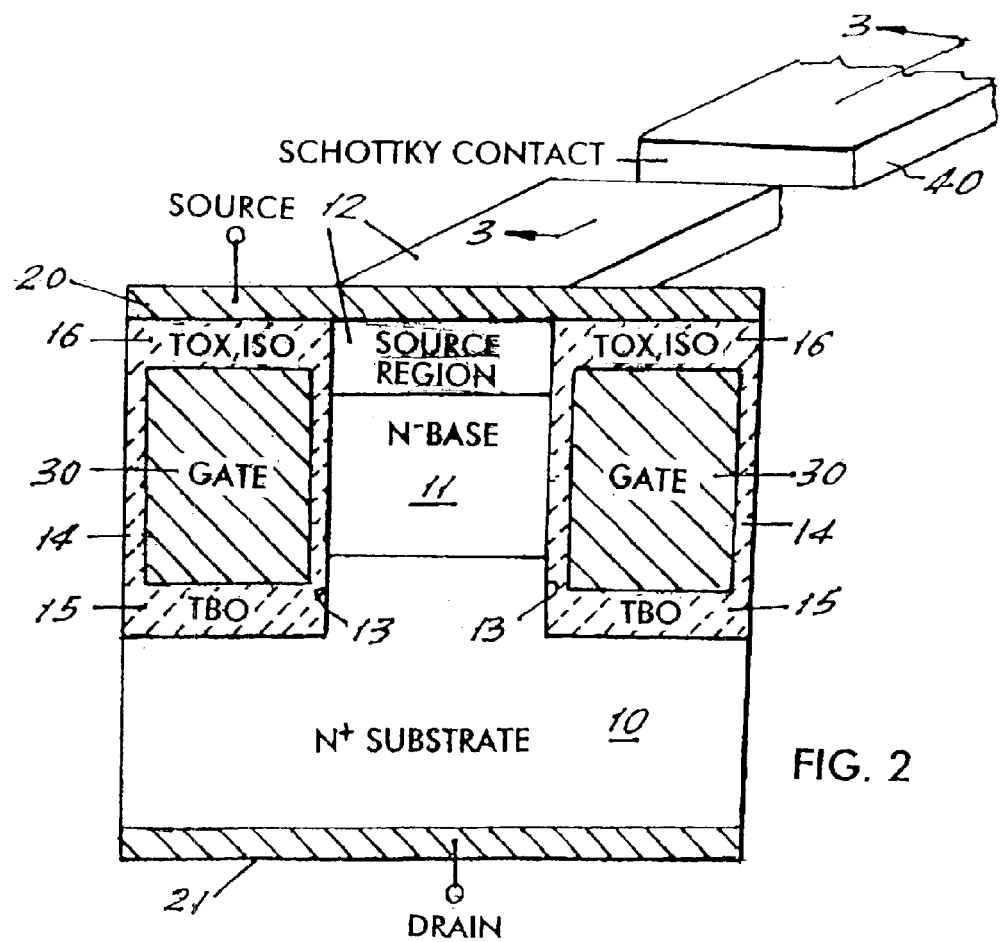
FIG. 2 shows FIG. 1 with an added Schottky diode integrated into the device silicon in accordance with the invention.

In FIG. 2, the source region 12 has a laterally projecting region of any desired shape which contains spaced openings such as openings 40 (FIG. 3) of any desired shape through which the aluminum source contact 20 (or any other Schottky-forming metal) can project to contact base 11 and form a Schottky diode.

Figure 3:
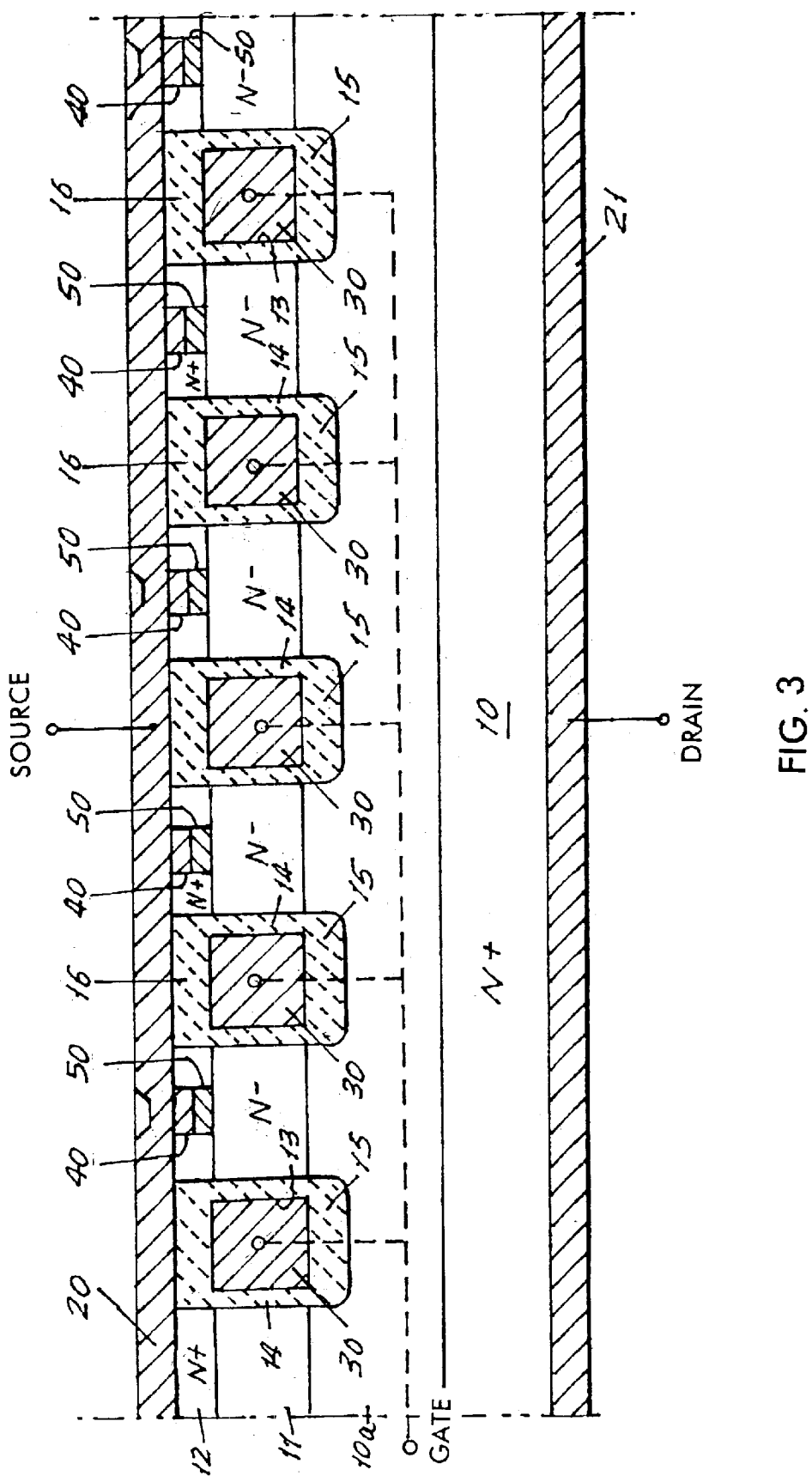
FIG. 3 is a cross-section of FIG. 2 to show the locations of the Schottky contacts between plural cells.
Figure 4:
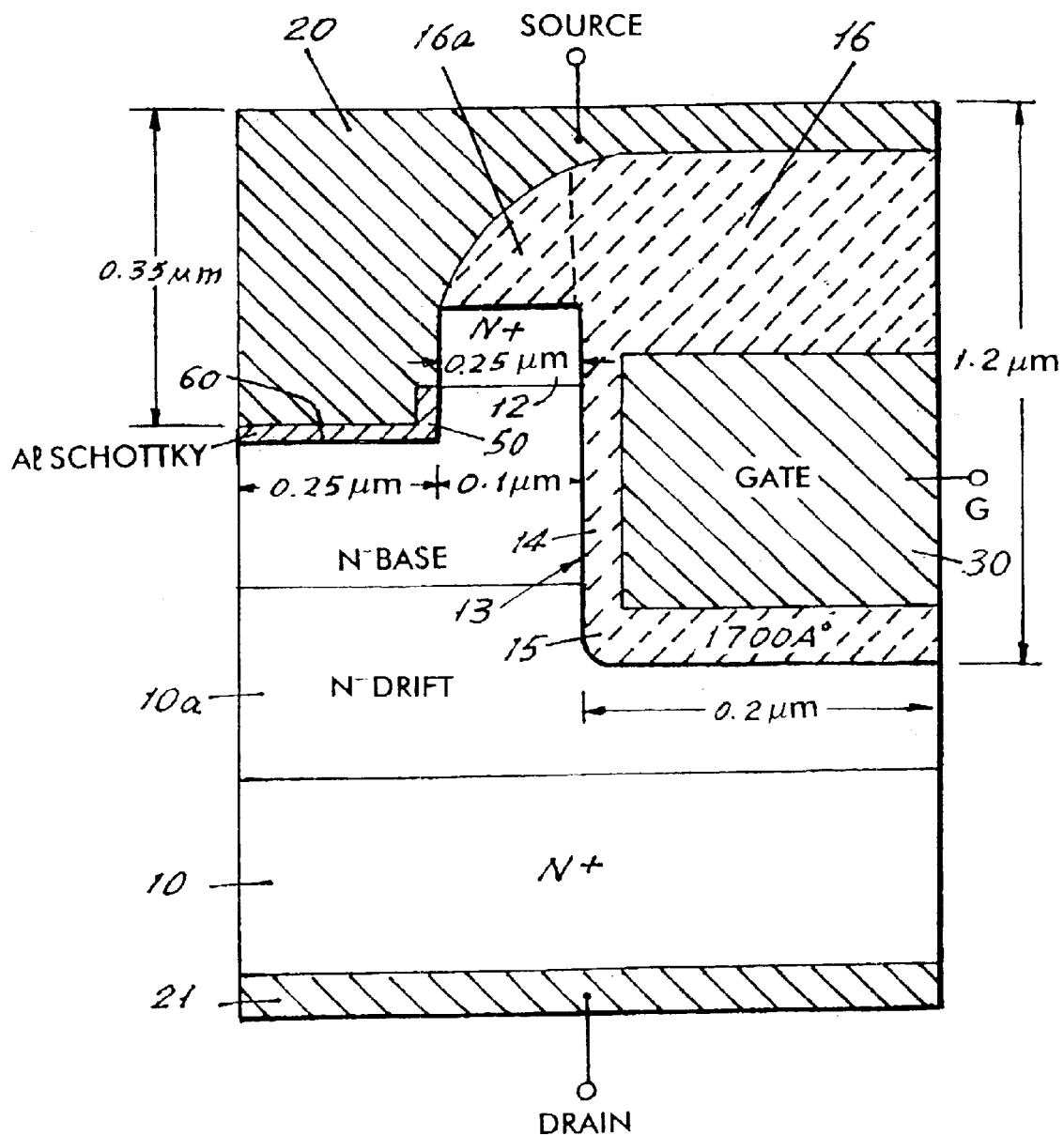
FIG. 4 shows a half cell cell of a device of the invention with preferred dimensions for the cell.

FIGS. 3 and 4 show the use of aluminum layers 50 as the Schottky forming barrier. Other Schottky barrier layer segments could be used. The opening 40 through the $N^+$ layer 12 may have any desired geometry, and such openings may be distributed over at least a major portion of the area of the $N^+$ source region 12 as shown in FIG. 3.

The modified structure of FIGS. 2, 3 and 4 achieves the following:

1. The source metal 20 on top of the $N^+$ source region 12 adjacent cross-section makes ohmic contact to the $N^+$ source region 12. However, a Schottky contact is made to the $N^-$ base region in the third dimension is indicated in FIG. 2.

2. This enables avalanche or thermally generated holes to be laterally collected by the Schottky contact and reduces the back-injected hole current into the N+ source region 12 thus averting the $BV_{DSS}$ snapback of the structure of FIG. 1.

FIG. 4 shows a single cell made according to the schematic diagrams of FIGS. 2 and 3. FIG. 4 shows the dimensions which can be used in the preferred embodiment of the invention. Note that the Schottky barrier in FIG. 4 is formed in a shallow trench 60 in the N+ source region 12 and into the N− base region. A thin Schottky barrier is formed by an enlarged area layer lining the sides and bottom of trench 60 and is contacted by the aluminum source contact 20 which also contacts the source region 12 as shown. The insulation layer 16 atop the gate is a silicon dioxide layer with a side wall spacer portion 16a.

A preferred method for forming the P type gate polysilicon includes the process steps of etching trenches 13 (and 60) and thereafter depositing a thin layer of polysilicon over the walls of trench 13. Thereafter, the deposited polysilicon receives a heavy boron implant. The remainder of the trench is then filled with undoped polysilicon and the boron implant is then activated, distributing the P charge throughout the polysilicon filler.

The structure of FIG. 4 is conceptually similar to that of FIG. 2 except that the Schottky can be formed without the need for an extra mask level. Further, $V_{th}$ is higher, dependent on gate oxide (tox, g) due to the band bending caused by the built-in potential of the Schottky contact to the N− base region. Both of these limitations are addressed while still retaining the original feature of the accumulation channel region device of having zero Qrr as in the device of FIGS. 1, 2 and 3.

Further, the device of FIG. 4, has improved EAS capability and has an increased Schottky conduction area. The half cell pitch in FIG. 4 is about 0.55 µm.

Figure 5:
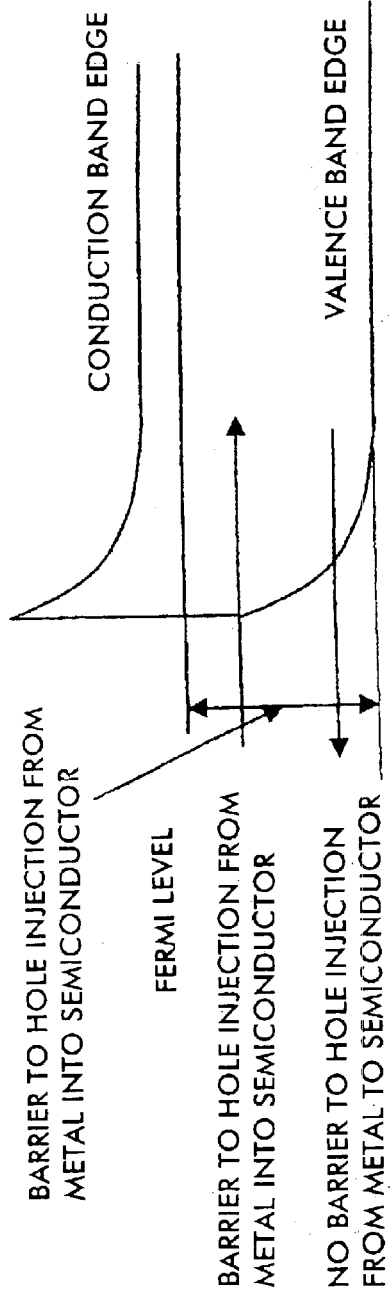
FIG. 5 shows band diagrams which illustrate the hole collection without barrier via the Schottky are of the device of FIG. 2.

FIG. 5 is a metal-semiconductor band diagram for an ideal Schottky diode to explain the operation of the device of FIGS. 2, 3 and 4. The diagram shows that holes will be collected from the N− base 11 to the metal 20. That is, holes will be collected from the N− base 11 to the Schottky metal 20 but will not be injected from the Schottky metal 20 to the base 11, thereby retaining the feature of no minority carrier (hole) injection into the N− base region 11.

Figure 6:
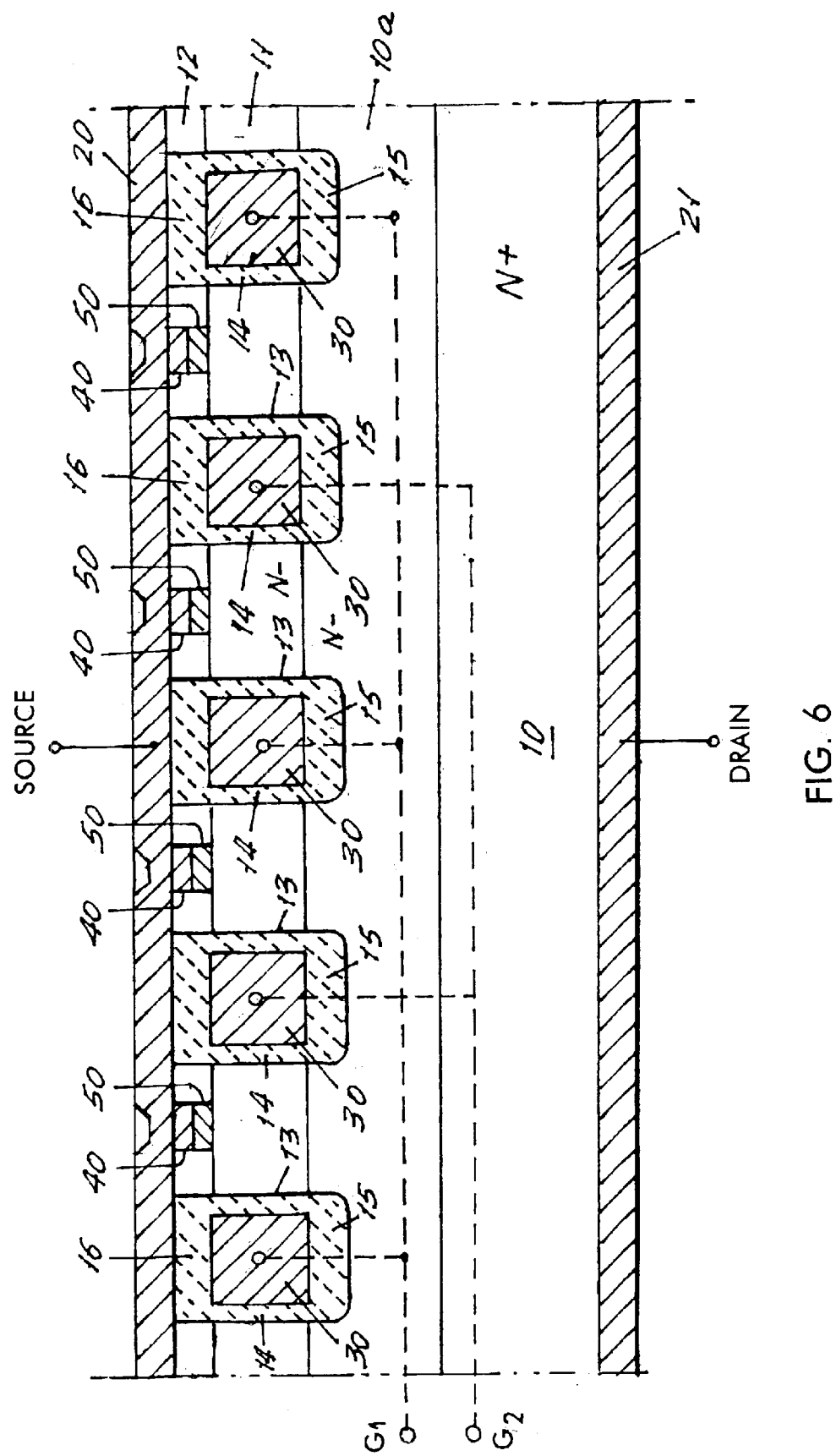
FIG. 6 shows the device of FIG. 2 wherein the gates are separately controlled as a dual gate device to permit $V_{th}$ control.

FIG. 6 shows a further embodiment of the device of FIG. 3 in which gates 30 are separately controlled from terminals G1 and G2, rather than being simultaneously energized as in FIGS. 1, 2, 3 and 4. The separation of the gates enables $V_{th}$ control while retaining the benefit of the integrated Schottky diode.

More specifically in FIG. 6;

1. During turn-on only gate $G_1$ is biased +ve with respect to source. Gate $G_2$ is shorted to the source. Using P-type gates, as in a conventional Accufet™ device structure a higher gate $G_1$ bias is needed to undo the band bending caused by gate $G_2$ along the trench sidewall controlled by gate $G_1$. This enables the $V_{th}$ of the channel controlled by gate $G_1$ to be determined by the gate oxide along the trench sidewall of gate $G_1$.

2. All such dual gate devices can be designed to have greater light load efficiencies. Basically, at light loads where the switching losses dominate, only the channel controlled by gate $G_1$ will be used thereby reducing the switching losses in half and at high loads, where conduction losses dominate, both the channels controlled by gate $G_1$ and gate $G_2$ will be used.

Figure 7:
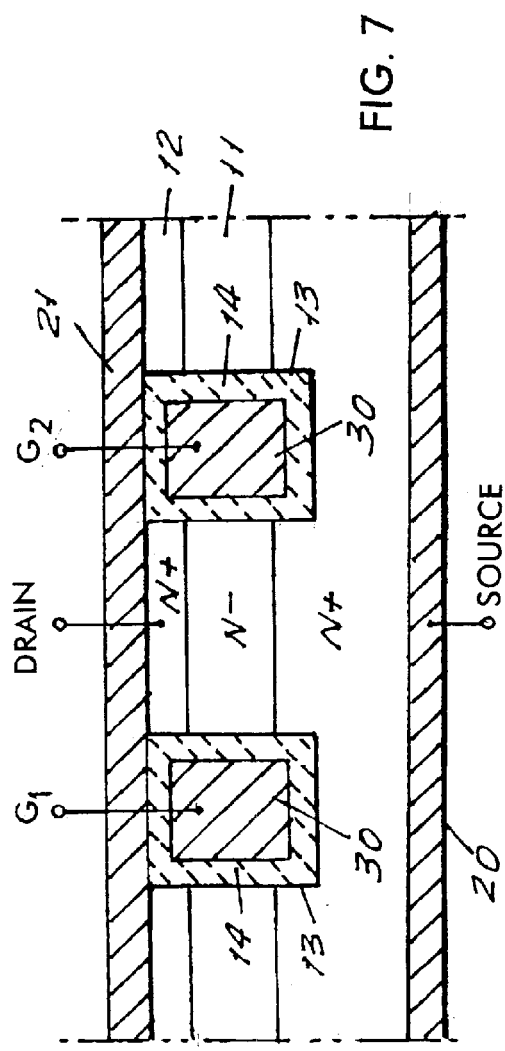
FIG. 7 shows a reversed source-drain device with the dual gate structure of FIG. 4.

FIG. 7 is a cross-section of a cell of a device in which the source and drain of FIGS. 2 and 3 are reversed and in which the two-gate structure of FIG. 6 is employed.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated accumulation channel field effect transistor comprising a highly conductive silicon substrate of one of the conductivity types; a drift region of said one of the conductivity types disposed above said substrate; a channel region of said one of the conductivity types disposed above said drift region and having an impurity concentration less than that of said substrate; a plurality of trenches extending through said channel regions and into said drift region; each of said trenches having respective gate oxide liners alone their vertical walls, and insulation liners at the bottoms of said trenches; a gate of the other conductivity type filling the interior of each of said trenches; an insulation cap over the tops of each of said gates in each of said trenches; a highly conductive source region disposed at the tops of the mesas between each of said trenches and above said channel regions which are in the mesas between each of said trenches; a Schottky barrier contact area formed in the top of each of said mesas; and a top contact metal connected to both said source regions and to said Schottky barrier contact areas; wherein a Schottky barrier contact layer is disposed on said Schottky barrier contact area and is contacted by said top contact metal.

2. The transistor of claim 1, wherein said Schottky barrier contact layer is aluminum.

3. The transistor of claim 1, wherein said one of the conductivity types is the N type.

4. The transistor of claim 2, wherein said one of the conductivity types is the N type.

5. The transistor of claim 1, which includes a second plurality of trenches formed in at least selected ones of said mesas and spaced from the walls of said trenches forming said mesas; said Schottky barrier contact areas being formed in respective ones of said second plurality of trenches.

6. The transistor of claim 2, which includes a second plurality of trenches formed in at least selected ones of said mesas and spaced from the walls of said trenches forming said mesas; said Schottky barrier contact areas being formed in respective ones of said second plurality of trenches.

7. The transistor of claim 3, which includes a second plurality of trenches formed in at least selected ones of said mesas and spaced from the walls of said trenches forming said mesas; said Schottky barrier contact areas being formed in respective ones of said second plurality of trenches.

8. The transistor of claim 4, which includes a second plurality of trenches formed in at least selected ones of said mesas and spaced from the walls of said trenches forming said mesas; said Schottky barrier contact areas being formed in respective ones of said second plurality of trenches.

9. A MOSgated accumulation channel field effect transistor comprising a highly conductive silicon substrate of one of the conductivity types; a drift region of said one of the conductivity types disposed above said substrate; a channel region of said one of the conductivity types disposed above said drift region and having an impurity concentration less than that of said substrate; a plurality of trenches extending through said channel regions and into said drift region; each of said trenches having respective gate oxide liners along their vertical walls, and insulation liners at the bottoms of said trenches; a gate of the other conductivity type filling the interior of each of said trenches; an insulation cap over the tops of each of said gates in each of said trenches; a highly conductive source region disposed at the tops of the mesas between each of said trenches and above said channel regions which are in the mesas between each of said trenches; a Schottky barrier contact area formed in the top of each of said mesas; a top contact metal connected to both said source regions and to said Schottky barrier contact areas; and first and second gate contacts for said gates filling said trenches; said first gate contact connected to a first set of said gates; said second gate connected to a second set of said gates.

10. The transistor of claim 9, which includes a second plurality of trenches formed in at least selected ones of said mesas and spaced from the walls of said trenches forming said mesas; said Schottky barrier contact areas being formed in respective ones of said second plurality of trenches.

11. The device of claim 4, wherein said gates are formed of P type polysilicon.

12. The transistor of claim 11, which includes a second plurality of trenches formed in at least selected ones of said mesas and spaced from the walls of said trenches forming said mesas; said Schottky barrier contact areas being formed in respective ones of said second plurality of trenches.

13. In a MOSgated accumulation channel field effect transistor having a plurality of mesas separated by parallel gate-filled trenches; the tops of said mesas having a central Schottky barrier-receiving trench of relatively high resistivity surface flanked by source regions of relatively low resistivity surface; and a top contact connected to said source region surface with an ohmic contact and to said Schottky barrier receiving trench surface with a Schottky contact; wherein the Schottky barrier receiving trench is lined with a Schottky barrier material.

14. The transistor of claim 13, wherein the Schottky barrier material is aluminum.

* * * * *